United States Patent
Hobbs (12)

(10) Patent No.: US 6,255,038 B1
(45) Date of Patent: Jul. 3, 2001

(54) PROCESS FOR MODULATING INTERFEROMETRIC LITHOGRAPHY PATTERNS TO RECORD SELECTED DISCRETE PATTERNS IN PHOTORESIST

(75) Inventor: Douglas S. Hobbs, Lexington, MA (US)

(73) Assignee: Optical Switch Corporation, Richardson, TX (US)

( * ) Notice: Subject to any disclaimer, the term of this patent is extended or adjusted under 35 U.S.C. 154(b) by 0 days.

(21) Appl. No.: 09/202,572

(22) PCT Filed: Jun. 10, 1997

(86) PCT No.: PCT/US97/09298

§ 371 Date: Feb. 16, 1999

§ 102(e) Date: Feb. 16, 1999

(87) PCT Pub. No.: WO97/48021

PCT Pub. Date: Dec. 18, 1997

Related U.S. Application Data

(60) Provisional application No. 60/019,490, filed on Jun. 10, 1996, now abandoned.

(51) Int. Cl.$^7$ ..................................................... G03C 5/00

(52) U.S. Cl. ..................... 430/316; 430/311; 430/312; 430/314; 430/323; 430/394; 430/313; 430/396

(58) Field of Search .................... 430/5, 313, 316, 430/311, 312, 314, 323, 394, 396

(56) References Cited

U.S. PATENT DOCUMENTS

| | | |
|---|---|---|
| 3,591,252 | 7/1971 | Lu . |
| 4,037,969 | 7/1977 | Feldman et al. . |
| 4,104,070 | 8/1978 | Moritz et al. . |
| 4,402,571 | 9/1983 | Cowan et al. . |
| 4,440,850 | 4/1984 | Paul et al. . |
| 4,496,216 | 1/1985 | Cowan . |
| 4,789,214 | 12/1988 | Vilhelmsson et al. . |
| 4,839,250 | 6/1989 | Cowan . |
| 4,874,213 | 10/1989 | Cowan . |
| 4,888,260 | 12/1989 | Cowan . |
| 5,003,567 | 3/1991 | Hawryluk et al. . |
| 5,055,383 | 10/1991 | Koblinger et al. . |
| 5,142,385 | 8/1992 | Anderson et al. . |
| 5,176,970 | 1/1993 | Hawryluk et al. . |
| 5,178,974 | 1/1993 | Hawryluk et al. . |
| 5,216,257 | 6/1993 | Brueck et al. . |
| 5,334,342 | 8/1994 | Harker et al. . |
| 5,343,292 | 8/1994 | Brueck et al. . |
| 5,384,464 | 1/1995 | DeFornel et al. . |
| 5,415,835 | 5/1995 | Brueck et al. . |
| 5,430,816 | 7/1995 | Furuya et al. . |
| 5,705,321 | * 1/1998 | Brueck et al. ........................ 430/316 |
| 6,027,388 | * 2/2001 | Jones et al. ............................ 445/24 |
| 6,042,998 | * 3/2000 | Brueck et al. ........................ 430/316 |

OTHER PUBLICATIONS

C.O. Bozler, C.T. Harris, S. Rabe, D.D. Rathman, M.A. Hollis, and H.I. Smith, "Arrays of gated field–emitter cones having 0.32 um tip–to–tip spacing", J. Vac. Sci. Technol. B 12(2), Mar./Apr. 1994, pp. 629–632.

(List continued on next page.)

*Primary Examiner*—Shean C. Wu

(57) ABSTRACT

A double exposure process is disclosed whereby a first exposure produced by conventional photolithographic techniques generates a latent negative image in a photoresist etch mask layer (22), the image subsequently employed to modulate a second exposure generated by the multiple beam interferometric lithography technique. Periodic surface relief structures (80) patterned by the second exposure and formed after development of the exposed photoresist material, are restricted to regions (52) defined by the initial exposure, with the photoresist material (54) outside these regions remaining unmodulated, or devoid of the periodic structures (80), and suitable for use as a mask in a subsequent etching process.

10 Claims, 4 Drawing Sheets

OTHER PUBLICATIONS

C.A. Spindt, "Field Emitter Arrays for Vacuum Microelectronics", IEEE Transactions On Electron Devices, vol. 38, No. 10, Oct. 1991, pp. 2355–2363.

Z. Huang, N.E. McGruer, and K. Warner, "200 nm Gated Field Emitters", IEEE Electron Device Letters, vol. 14, No. 3, Mar. 1993.

J.W. Goodman, Introduction to Fourier Optics, McGraw–Hill, San Fran., 1968.

C.G. Bernhard, "Structural and functional adaptation in a visual system.", Endeavor, 26, pp. 79–84, 1967.

P.B. Clapham and M.C. Hutley, "Reduction of lens reflexion by the 'Moth Eye' principle", Nature, 244, pp. 281–282, Aug. 3, 1973.

M.C. Hutley & S.J. Wilson, "The optical properties of 'moth–eye' antireflection surfaces", Optica Acta, vol. 29, No. 7, pp. 993–1009, 1982.

W.H. Southwell, "Pyramid–array surface relief structures producing antireflection index matching on optical surfaces", JOSA A, vol. 8, No. 3, 549–553, Mar. 1991.

J.F. DeNatale et. al., "Fabrication and characterization of diamond moth eye antireflection surfaces on Ge", J. Appl. Phys., 71,(3), pp. 1388–1393, Feb. 1, 1992.

A.B. Harker and J.F. DeNatale, "Diamond gradient index 'moth eye' antireflection surfaces for LWIR windows", SPIE vol. 1760, Window and Dome Technologies and Materials III, pp. 261–267, Jul. 1992.

Murakami, T., Togari, H., & Steinman, A., "Electrostatic problems and ionization solutions in TFT–LCD production", Solid State Technology, Jan. 1997, pp. 99–102.

Hatoh, H., et al., "Dependence of pretilt angle on the topography of substrate in liquid crystal alignment brought about by rubbing technique", Appl. Phys. Lett., 64, (9), pp. 1103–1104, Feb. 28, 1994.

Coherent laser company specifications, Innova argon–ion laser lifetime data, 1997.

J.J. Cowan, "Holographic honeycomb microlens", Optical Engineering, vol. 24, No. 5, Sep./Oct. 1985, pp. 796–802.

Dammann, H., and Klotz, E., Optica Acta, 1977, vol. 24 pp. 505–515 Coherent Optical Generation and Inspection of Two–Dimensional Periodic Structures.

Leith, E.N., Hershey R.R., and Chen, H.S., "Techniques for quality fringe generation", SPIE vol. 1211, Computer and Optically Formed Holographic Optics (1990) pp. 158–165.

K. Derbyshire, "Beyond AMLCDs: Field Emission Displays?", Solid State Technology, Nov. 1994, pp. 55–63.

G.P. Bryan–Brown, et.al., "Grating Aligned Bistable Nematic Device", SID 97 Symposium Digest vol. XXVIII, May 11–16, 1997, pp. 37–40.

J.P. Ryan and M. Steinberg, WDM and Optical Networks: Market Directions, Optics and Photonics News, OSA, Feb. 1998, p. 25.

M.L. Schattenburg, H.I. Smith, et. al., "Fabrication of high energy x–ray transmission gratings for AXAF", SPIE Proceedings 2280, San Diego, CA Jul. 24–29,1994.

J. Ferrera, M.L. Schattenburg, H.I. Smith, "Analysis of distortion in interferometric lithography", J. Vac. Sci. Technol. B, 14(6), p. 4009, Nov./Dec. 1996.

Brewer Science, Inc., Rolla,Mo ARC XLT–20 coating, 1992.

H. Hock, C. King, and J. Helbert, "Resist Image Reversal for Next–generation VLSI Circuit Fabrication", Semiconductor International, Sep. 1987, pp. 164–168.

M. Long & J. Newman, "Image Reversal Techniques with Standard Positive Photoresist", SPIE Proceedings, vol. 469, Advances in Resist Technology, 1984, p. 189.

C. Hartglass, "Optimization of Image Reversal of Positive Photoresist", Proceedings of Kodk Interface, 1985.

Shank et al., "Optical Technique for producing 0.1 $\mu$m periodic structures", Applied Physics Letters, vol. 23, No. 3, Aug. 1973.

* cited by examiner

US 6,255,038 B1

PROCESS FOR MODULATING INTERFEROMETRIC LITHOGRAPHY PATTERNS TO RECORD SELECTED DISCRETE PATTERNS IN PHOTORESIST

This is a continuation of U.S. provisional application Ser. No. 60/019,490, filed Jun. 10, 1996 abandoned.

BACKGROUND OF THE INVENTION

1. Field of the Invention

The present invention relates to a process for producing a plurality of discrete arrays of sub-micron structures in a photoresist etch mask by interferometric or holographic lithography techniques; each of the arrays is bounded by regions not subjected to the interferometric lithography.

2. Discussion of the Prior Art

Holographic or interferometric lithography is now a proven technology for creating structures having sizes smaller than a micron in a continuous, two-dimensional, periodic array. For example, U.S. Pat. Nos. 4,402,571, and 4,496,216, to Cowan, et al. and U.S. Pat. No. 5,142,385, to Anderson et al., the entire disclosures of which are incorporated herein by reference, disclose methods and apparatus for producing a periodic and continuous surface relief pattern in a surface by exposing a photosensitive material to a laser interference fringe pattern and then developing the photosensitive material. Interferometric lithography exploits the mutual coherence of multiple optical beams derived from a single laser; the beams are overlapped in a selected region of space and interfere to produce patterns of light and dark areas, or fringe patterns, repeating on a scale proportional to the laser wavelength. The fringe patterns are recorded in photosensitive media such as photoresist. Conventional contact or projection photomasks are not required and so interferometric lithography has become known as "maskless" lithography.

Interferometric lithography has been used in a laboratory environment in attempting to produce a flat panel display having a distributed cathode; the display is known as a Field Emission Display (FED). A FED is a distributed cathode, flat panel analog to the well known Cathode Ray Tube (CRT) and can include billions of microscopic cathode electron 'guns' in an array distributed over the surface of a display substrate. Electrons emitted from the microscopic, cone shaped cathodes, under the influence of a large accelerating potential, strike a phosphor screen disposed opposite a common anode, and are thereby converted to photons (i.e., light). In making the cathode matrix in a FED, it has been discovered that the most critical fabrication step is patterning of an array of high resolution features such as holes or cathode emitter tips. In the prior art, a photosensitive medium such as photoresist was employed to record an image of a hole array formed by a conventional photolithographic technique such as contact printing with shadow masking techniques, optical projection, or electron beam writing. The array of holes in photoresist was then used as an etch mask in forming the emitter wells.

It would be desirable to use interferometric lithography in making an etch mask for fabricating FEDs, but the continuous nature of interferometric lithography fringe patterns is not suitable for use in an etch mask which must have cathode cone holes (or tips) only in preselected pixel or sub-pixel regions. In other technologies, a similar problem exists, for example, in making a Dynamic Random Access Memory (DRAM), Central Processing Unit (CPU) or a logic chip, high density patterns in an etch mask must be confined within or combined with other patterns for leadouts, contact vias or individual device area patterns. There is a need, therefore, for a method to selectively negate exposure to interferometric fringe patterns in areas outside selected regions such as the pixel region, but without a requirement for removing the photoresist. There is also a need for a method or process for making an etch mask for producing FEDs which requires the fewest number of process steps and which can be completed in the least amount of time, to satisfy economic requirements as dictated by the marketplace.

OBJECTS AND SUMMARY OF THE INVENTION

Accordingly, it is a primary object of the present invention to overcome the above mentioned difficulties by providing a method for making an etch mask having a plurality of discontinuous and discrete arrays containing a high density of high resolution features created by interferometric lithography.

Another object of the present invention is providing an efficient and effective method for making an etch mask segmented in a selected number of discontinuous subareas in which high resolution interferometric lithography can be used to provide sub-micron sized structures.

The aforesaid objects are achieved individually and in combination, and it is not intended that the present invention be construed as requiring two or more of the objects to be combined unless expressly required by the claims attached hereto.

In accordance with the method of the present invention, patterns of sub-micron structures in a photoresist etch mask are produced by interferometric or holographic lithography techniques after image-wise exposure using photolithographically generated pattern overlays. In the first step, negative pattern overlays are used to create a plurality of sub-pixel regions of blocked or shaded photoresist bounded by a larger, rectangular region of exposed or illuminated photoresist. In the second step, the photoresist etch mask layer is chemically affected, either thermally or by flooding or immersion in a gaseous or liquid environment, such as saturation with ammonia vapor, thereby rendering the formerly exposed rectangular region of photoresist insensitive to further light exposure and insoluble in subsequent etching steps. In the third step, a sub-micron, high resolution light interference pattern is modulated or apertured in the photoresist layer etch mask, in situ, by the now insensitive, low resolution photoresist negative pattern, whereupon the light interference pattern causes periodic arrays of sub-micron exposed spots only in sub-pixel regions of the light sensitive photoresist. In the fourth step, the photoresist layer is chemically developed and the exposed spots are etched away, leaving a plurality of discrete (i.e., separate) periodic arrays of sub-micron holes in the etch mask.

The above and still further objects, features and advantages of the present invention will become apparent upon consideration of the following detailed description of a specific embodiment thereof, particularly when taken in conjunction with the accompanying drawings, wherein like reference numerals in the various figures are utilized to designate like components.

BRIEF DESCRIPTION OF THE DRAWINGS

FIG. 2a is an overhead view the single pixel, illustrating method step two, saturation with ammonia vapor of the photoresist bearing the latent image formed by the exposure of the step of FIG. 1a.

FIG. 2b is a cross-sectional view of the single pixel illustrating the saturation step taken along line A–A' of FIG. 2a.

DESCRIPTION OF THE PREFERRED EMBODIMENT

In accordance with standard industry practice, a layer of positive photoresist material is coated onto a suitable substrate material such as glass, silicon or sapphire.

Figure 1A:
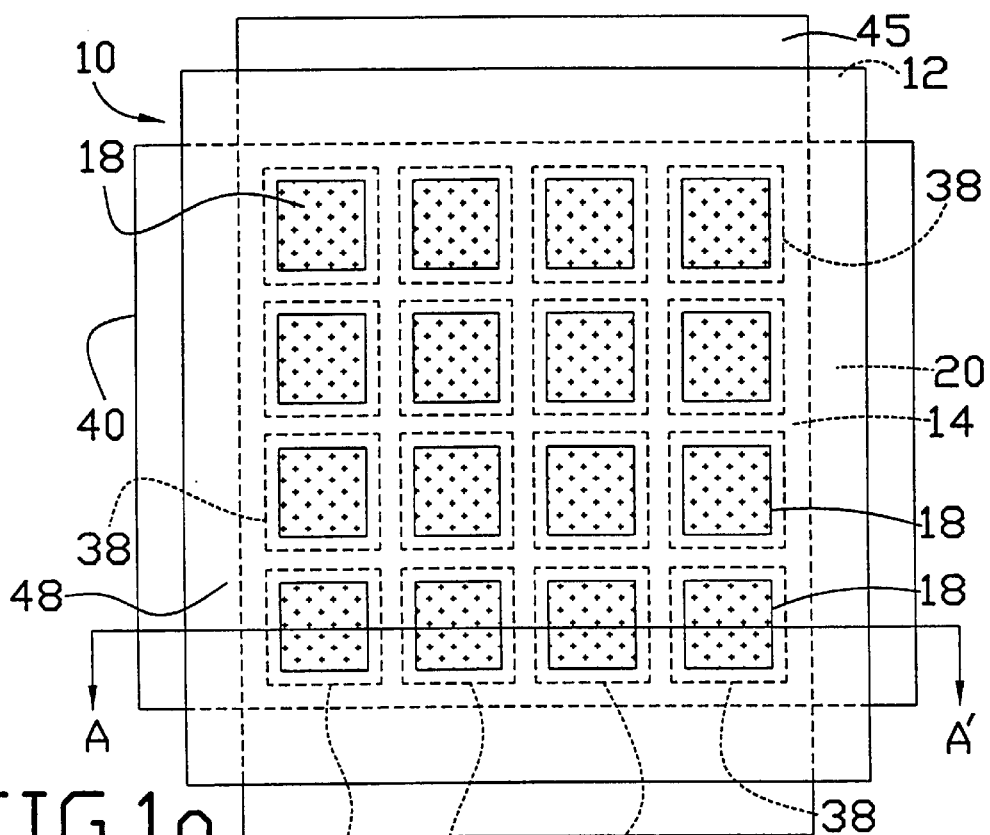
FIG. 1*a* is an overhead view of a single pixel in a field emission display, illustrating method step one, an initial light exposure delineating sub-pixel regions as defined by a cathode mesh adapted to contain an array of half-micron holes to be patterned using a holographic technique in subsequent steps.
Figure 1B:
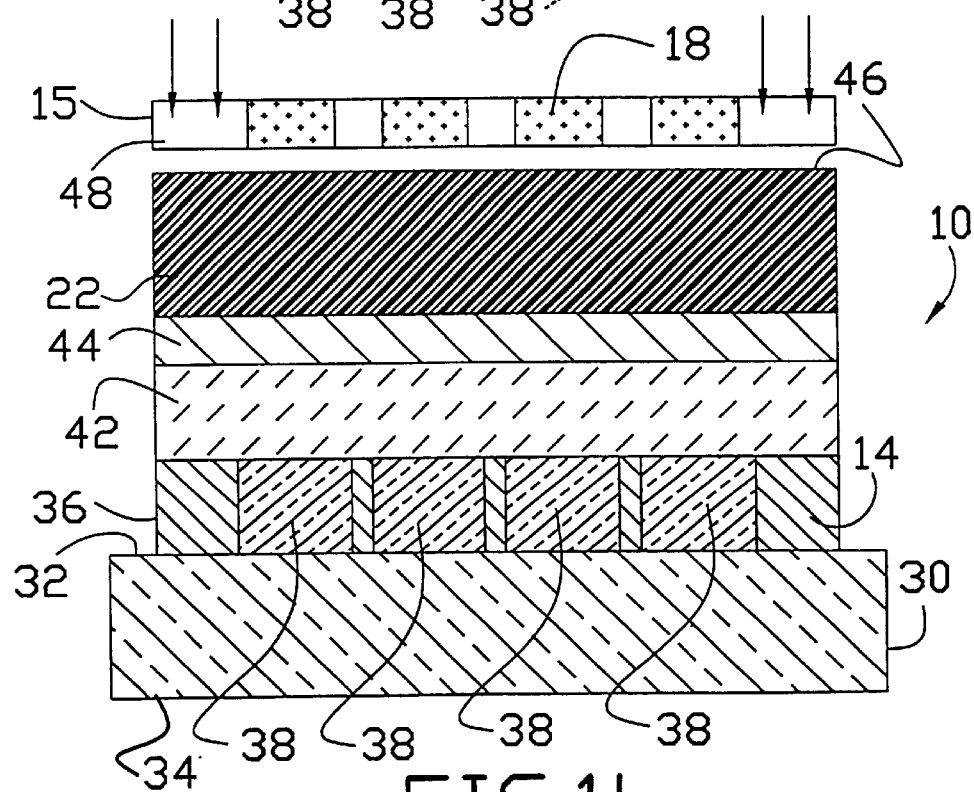
FIG. 1b is a cross-sectional view of the single pixel taken along line A–A' of FIG. 1a illustrating the initial light exposure to delineate sub-pixel regions.

Referring specifically to FIGS. 1a and 1b of the accompanying drawings, an overhead view of a subsection of a field emission display substrate 10 corresponds to the area required for a single pixel 12 including a cathode mesh 14. FIG. 1a includes an imaginary planar layer 15 of light and shaded regions illustrating incident light (or the lack thereof in an imaginary cross section. In a first method step using conventional photolithographic techniques such as shadow masking (i.e., contact printing) or optical projection, an initial, negative pattern, image-wise exposure to light includes sixteen square blocked (i.e., shaded or dark) areas 18 all within and bounded by an illuminated, substantially rectangular mesh-shaped area 20. The pattern shown in FIG. 1a is a pixel area definition image, as is required during manufacture of a FED panel. Blocked or dark areas 18 delineate sub-pixel regions as defined by cathode mesh 14. FIG. 1b is a cross-sectional view of the single pixel 12 taken along line A–A' of FIG. 1a, and illustrates the initial light exposure to delineate blocked sub-pixel regions 18 in a 6000 Å thick photoresist layer 22.

As shown in FIG. 1b, display substrate 10 includes a substantially planar glass base layer 30 having an upper surface 32 opposing a lower surface 34. A 5000 Å thick Molybdenum and Silicon (Moly/Si) layer 36 is adhered to glass base layer upper surface 32 and includes sixteen square, discrete Silicon (Si) sub pixel regions 38 all within and bounded by a Molybdenum (Moly) cathode mesh 14 electrically connected to the cathode line 40 as shown in FIG. 1a. A 4000 Å thick Silicon Dioxide ($SiO_2$) layer 42 is disposed upon and adhered to an upper surface of the Moly/Si layer 36, opposite the glass base layer 30. A 1000 Å thick Niobium (Nb) gate layer 44 is disposed upon and adhered to an upper surface of the $SiO_2$ layer 42, opposite the Moly/Si layer 36 and is electrically connected to the gate line 45 as shown in FIG. 1a. The photoresist (PR) layer 22 is disposed upon and adhered to an upper surface of the Nb layer 44, opposite the SiO2 layer 42, and has an uppermost surface 46, part of which is exposed to the light in region 48 (i.e., corresponding to a portion of illuminated area 20 as seen in imaginary layer 15) during the first step. The exposure to the light during the first step chemically alters the composition of the illuminated and exposed area 20 of the photoresist layer 22, as is well known in the art.

Figure 2A:
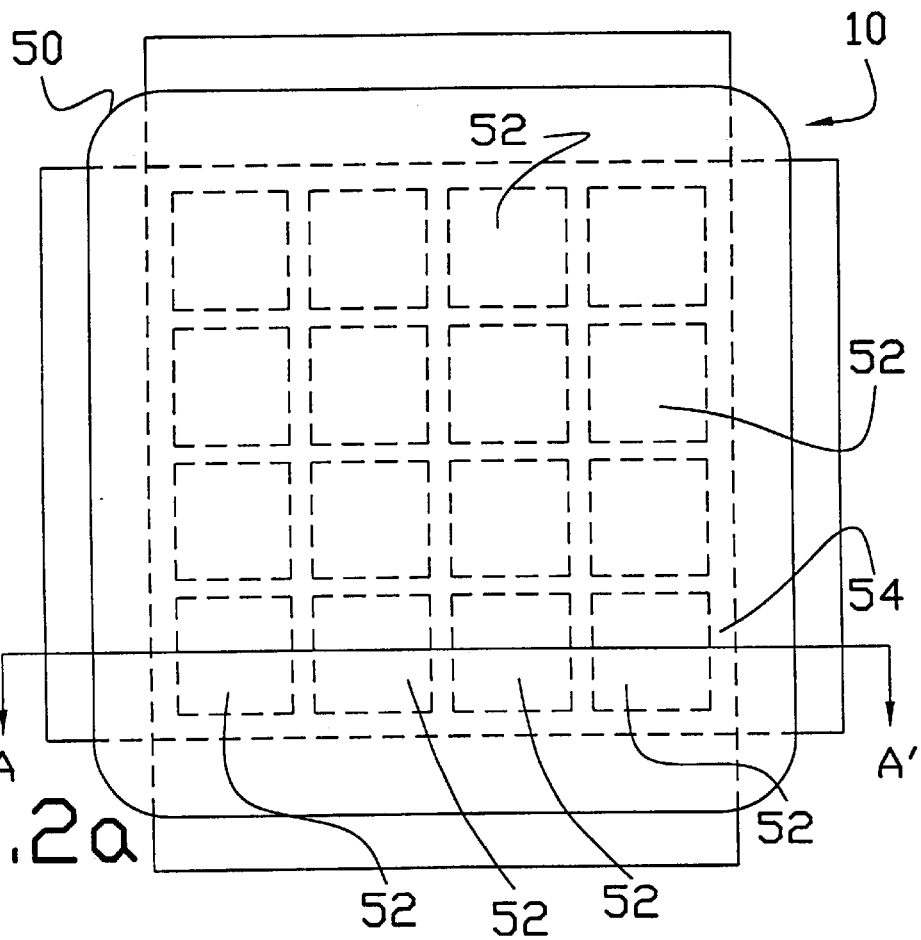
Figure 2B:
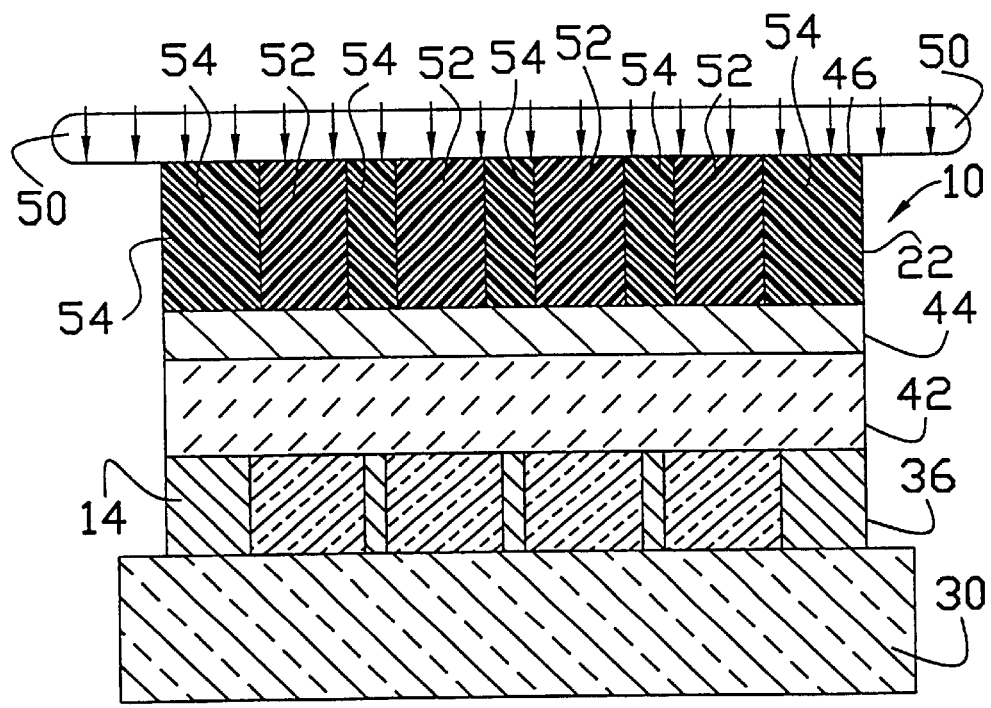

As shown in FIGS. 2a and 2b, the second method step is exposure or saturation with ammonia vapor (illustrated schematically as layer 50) of the photoresist layer 22, now bearing the latent image formed by the light exposure of the first method step illustrated in FIG. 1a. The latent image includes sixteen square, unaffected and previously blocked or shaded regions 52 all within and bounded by an affected, previously illuminated, substantially rectangular area 54 corresponding to the illuminated area 20 in FIG. 1a and 1b. The unaffected regions 52 correspond to the sub-pixel regions of blocked areas 18 in FIGS. 1a and 1b. In the second step, photoresist etch mask layer 22 is chemically altered or affected, either by flooding or immersion in a gaseous or liquid environment (e.g., saturation with ammonia vapor 50 heated to a temperature at or above one hundred degrees Celsius for a period of approximately ten minutes) or thermally, as is known in the art, thereby rendering the formerly exposed rectangular region 54 of photoresist insensitive to further light exposure and insoluble in subsequent developing steps. The step of chemically affecting photoresist etch mask layer 22 may be carried out in an image reversal oven, a conventional component in most semiconductor fabrication facilities. Alternatively, a chemical compound is added to photoresist layer 22 and heated, thereby causing previously exposed sections of the photoresist layer to cross link.

Figure 3A:
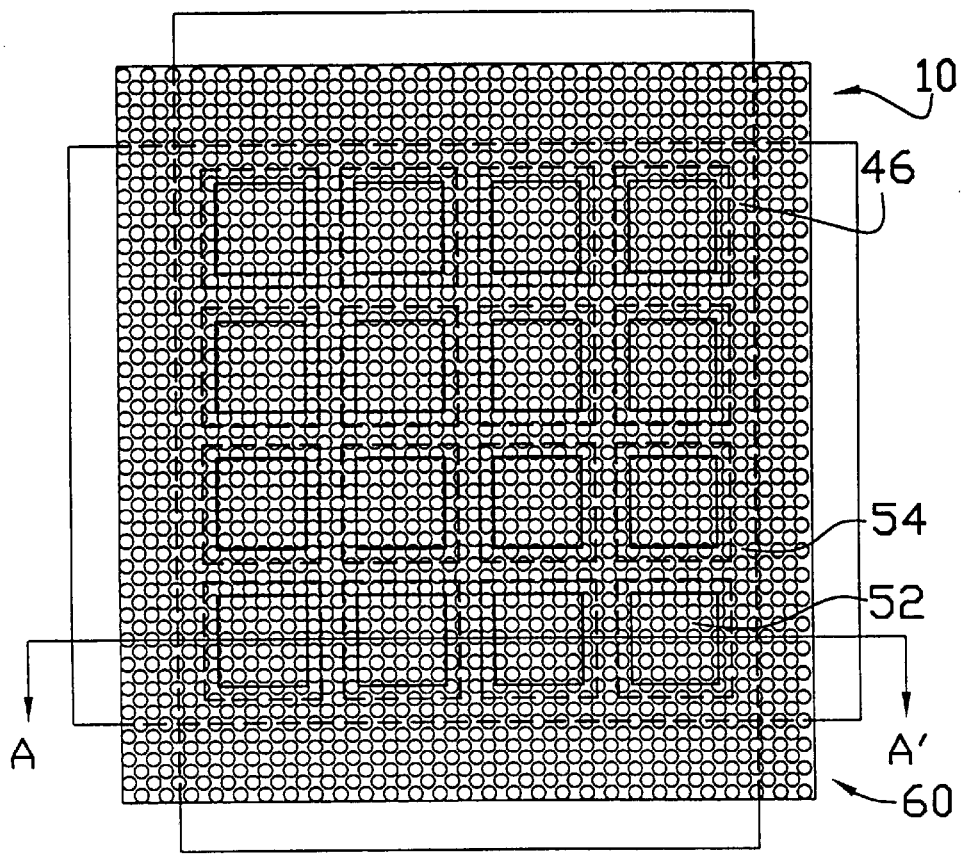
FIG. 3a is an overhead view of the single pixel, illustrating method step three, a holographic or interferometric exposure to form a latent image of an array of half-micron areas of high luminous intensity.
Figure 3B:
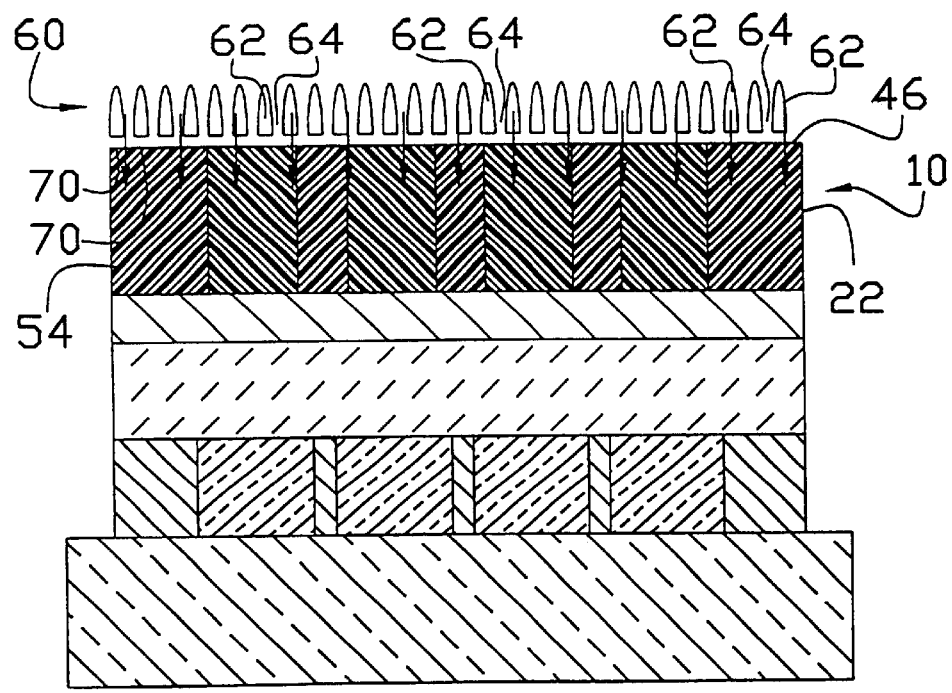
FIG. 3b is a cross-sectional view of the single pixel illustrating the holographic exposure step taken along line A–A' of FIG. 3a and showing the placement of the half-micron areas of high luminous intensity.

Turning now to FIGS. 3a and 3b, illustrating method step three, a holographic or interferometric exposure is utilized to form a latent image of a periodic array of half-micron areas of high luminous intensity 62 separated by null areas of low luminous intensity 64. In the third step, a sub-micron, high resolution light interference pattern 60 is modulated or apertured in the photoresist layer etch mask 22, in situ, by the now insensitive, low resolution photoresist negative pattern 54, whereupon the light interference pattern 60 causes sub-micron exposed spots 70 only in the light sensitive photoresist in the sub-pixel regions 52. Light interference pattern 60 is a periodic and continuous laser interference fringe pattern created from the mutual coherence of multiple optical beams derived from a single laser; the beams are overlapped in a region of space just over the uppermost surface 46 of the photoresist layer 22 and interfere to produce areas of high luminous intensity 62 and areas of low luminous intensity 64 or fringe patterns, repeating on a scale proportional to the laser wavelength. The fringe patterns are recorded in a periodic two-dimensional close-packed array of exposed spots 70 in only the still photosensitive sub-pixel regions 52 of photoresist layer 22.

Figure 4A:
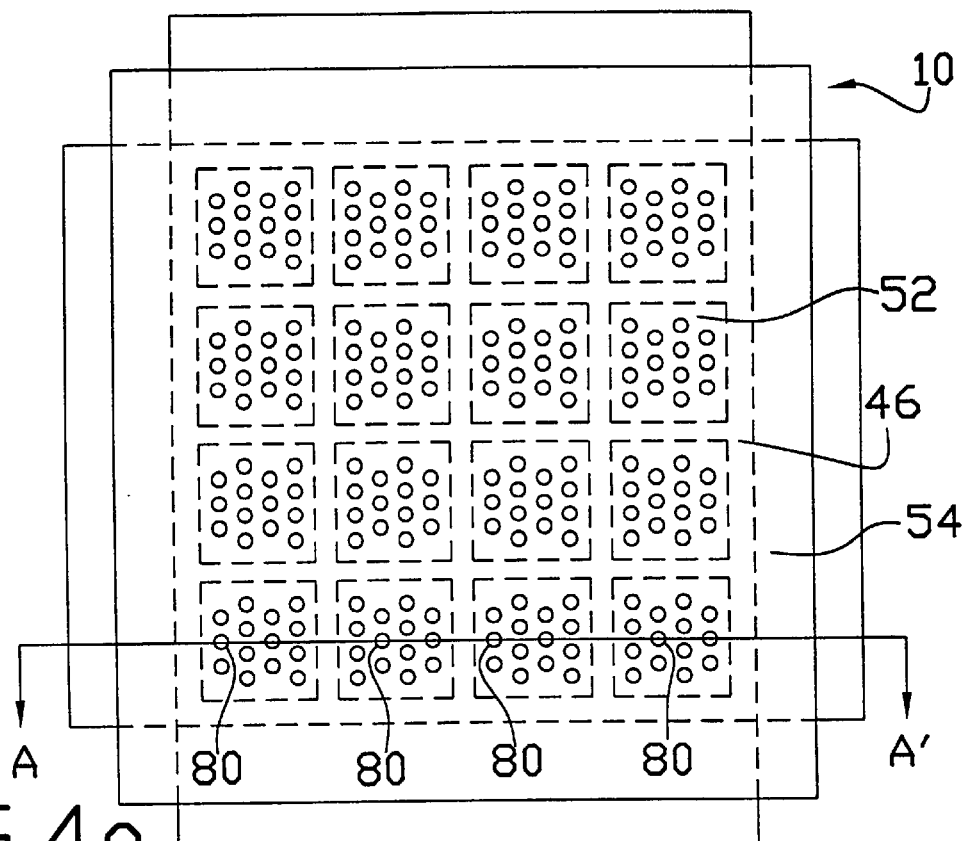
FIG. 4a is an overhead view of the single pixel, illustrating the resulting photoresist etch mask layer after method step four, a development step, leaving a plurality of periodic arrays of etch mask holes disposed only in the sub-pixel regions.
Figure 4B:
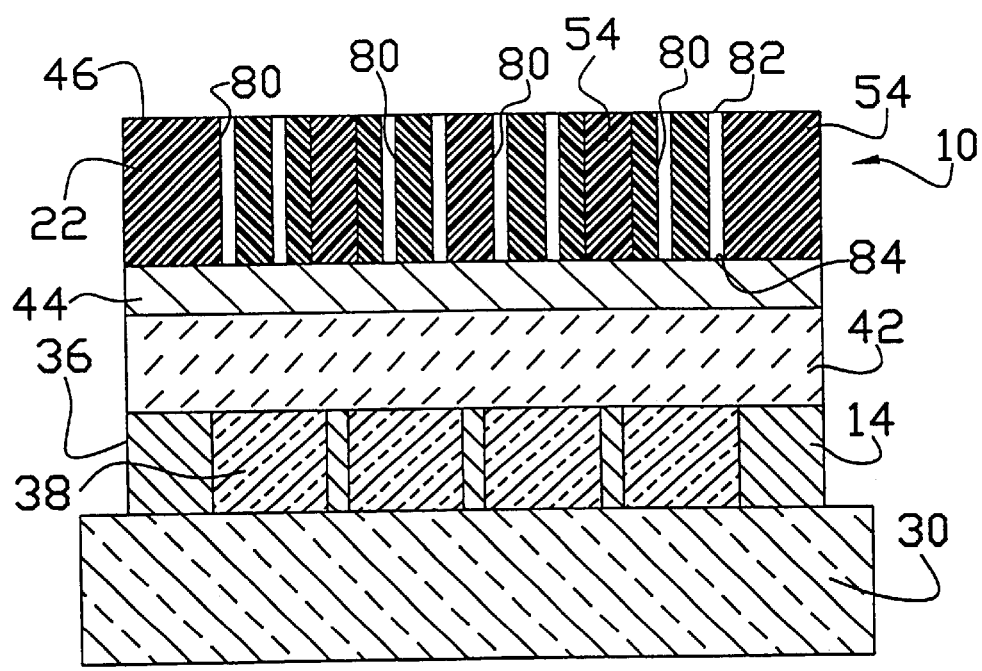
FIG. 4b is a cross-sectional view of the single pixel taken along line A–A' of FIG. 4a, illustrating the resulting photoresist etch mask layer, after developments.

In the fourth step as shown in FIGS. 4a and 4b, photoresist etch mask layer 22 is chemically developed in accordance with standard industry practice in a (preferably aqueous) liquid developer and the exposed spots 70 (FIG. 3b) are dissolved away, leaving sub-micron diameter right circular cylindrical holes 80 in and through the etch mask layer 22. Each etch mask hole 80 has a first open end 82 at the uppermost surface 46 in fluid communication with a second open end 84 at the interface between the photoresist layer 22 and the Nb layer 44. After the development step, a plurality of periodic arrays of etch mask holes 80 are disposed in the separate sub-pixel regions 52. The etch mask holes are disposed only in the sub-pixel regions 52 and are not present in the surrounding affected area 54; thus the sub-pixel regions are deemed to contain discrete (i.e., spaced or separate) arrays of sub-micron etch mask holes 80.

For purposes of defining nomenclature, the method of the present invention uses the affected and insensitive area 54 to spatially modulate or to provide an aperture for use in the interferometric lithography steps to follow. The affected and insensitive area 54 remains unmodulated or unperforated by etch mask holes and permits the photoresist layer to be used as an etch mask in the subsequent etching process used in finishing the FED.

The source of illumination used to initially expose the photoresist layer 22 can be an optical image projector with an optical mask and lenses as is known in the art, or can include a shadow mask for contact printing; alternatively, a scanning electron beam, scanning laser beam or proximity printing can be used. In each alternative, the process is an image reversal process using a negative image of a selected pattern; when using a scanning electron beam or scanning laser, the pattern may be stored in software such that pattern software in a beam controller directs writing with the scanning (electron or laser) beam. In each of the above examples the photoresist layer is exposed using actinic radiation.

The method of the present invention may be characterized in general terms as a method for producing an etch mask in a photoresist layer over a substrate (e.g., FED display substrate 10) for lithographic processing including the following steps:

1) controlling the locations at which a source of illumination shines upon the photoresist layer (e.g., etch mask 22) by use of a first pattern; where the first pattern defines a first selected region (e.g., a first blocked sub-pixel area 18), a second selected region (e.g., a second blocked sub-pixel area 18) and a third selected region (e.g., an illuminated area 20), where the first selected region and the second selected region are bounded by the third selected region; and exposing the photoresist layer to illumination from the source of illumination such that illumination is not transmitted for the first pattern first selected region and the second selected region and illumination is transmitted for the first pattern third selected region, whereby the photoresist layer is not exposed in a first sub-area (e.g., regions 52) corresponding to the first pattern first selected region, and is not exposed in a second sub-area corresponding to the pattern second selected region, and is exposed in a third sub-area (e.g., region 54) corresponding to the first pattern third selected region;

2) exposing the photoresist layer to a reactive environment (e.g., an image reversal oven containing a fluid such as ammonia vapor); reactive environment exposure alters the photoresist layer in the third sub-area to an impervious state;

3) exposing the photoresist layer to a periodic pattern of interferometric illumination (e.g., pattern 60, by multiple laser beam interferometry) and altering the photoresist layer in the first and second subareas with a periodic pattern of exposed spots (e.g., spots 70), while the third sub-area is substantially insensitive to and unaffected by the interferometric illumination; and 4) developing the photoresist layer and removing the photoresist material only in the spots exposed to the interferometric light and within the first and second subareas to make etch mask holes (e.g., holes 80).

As an aside, it should be noted that in a completed FED, an anode (not shown) is customarily disposed in close proximity to the cathode mesh 14 and includes a glass layer coated with a conductive material and a phosphor.

A number of variations are possible. For example, the thickness of photoresist layer 22 can be in the range of 1000 Å to 20,000 Å. Cathode mesh 39 can be any suitable conductor. Niobium Gate layer 44 can be any suitable material which will preserve the gate function. Additionally, any arbitrarily selected region can be patterned as a first, larger area (e.g., pixel area 12) and subdivided into a plurality of subareas (e.g., sub-pixel regions 18, 52).

Having described preferred embodiments of a new and improved method, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A method for confining interference lithography patterning to discrete areas of a photoresist while maintaining a surrounding photoresist region that bounds the discrete areas, comprising the steps of:

(a) exposing the surrounding photoresist region without exposing the discrete areas of the photoresist;

(b) treating the photoresist to make the exposed surrounding photoresist region insensitive to further exposure and insoluble in a photoresist developer;

(c) selectively exposing the discrete areas of the photoresist using interference lithography; and (d) developing the photoresist to remove exposed photoresist within the discrete areas to form a repetitive pattern within the discrete areas without removing the surrounding photoresist region, such that the surrounding photoresist region remains as a protective etch mask that confines subsequent etch processing of an underlying layer to the discrete areas.

2. The method of claim 1, wherein step (a) includes exposing the surrounding photoresist region using an exposure technique other than interference lithography.

3. The method of claim 1, wherein step (a) includes using a shadow mask to prevent exposure of the discrete areas while exposing the surrounding photoresist region.

4. The method of claim 1, wherein step (a) includes exposing the surrounding photoresist region using and electron beam.

5. The method of claim 1, wherein step (a) includes exposing the surrounding photoresist region with a laser beam.

6. The method of claim 1, wherein step (b) includes applying a fluid reactive agent to the photoresist.

7. The method of claim 6, wherein the fluid reactive agent is ammonia vapor.

8. The method of claim 1, wherein step (b) includes heating the photoresist to a temperature of at least 100° C.

9. The method of claim 1, wherein the photoresist is part of a layered structure that includes discrete electrode regions formed in a lower layer, wherein the discrete regions of the photoresist are aligned with the electrode regions and the protective etch mask confines etching to portions of layers underlying the discrete regions and overlying the discrete electrode regions.

10. The method of claim 9, further comprising forming a field emitter display by etching emitter tips in portions of the layered structure underlying the discrete areas of the photoresist in correspondence with the discrete electrode regions.

* * * * *